United States Patent
Wu et al.

(10) Patent No.: US 10,854,290 B1
(45) Date of Patent: Dec. 1, 2020

(54) UTILIZING A FLASH MEMORY DRIVE WHICH INCLUDES SINGLE-LEVEL CELL FLASH MEMORY AND MULTI-LEVEL CELL FLASH MEMORY

(71) Applicant: EMC IP Holding Company LLC, Hopkinton, MA (US)

(72) Inventors: Bo Wu, Shanghai (CN); Guangliang Lei, Shanghai (CN); Scott David Von Rhee, Boston, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 702 days.

(21) Appl. No.: 14/751,507

(22) Filed: Jun. 26, 2015

(51) Int. Cl.
*G11C 14/00* (2006.01)
*G06F 12/02* (2006.01)
*G11C 7/10* (2006.01)
*G11C 16/04* (2006.01)

(52) U.S. Cl.
CPC ...... *G11C 14/0018* (2013.01); *G06F 12/0246* (2013.01); *G11C 7/1072* (2013.01); *G06F 2212/2228* (2013.01); *G06F 2212/7203* (2013.01); *G11C 16/0441* (2013.01)

(58) Field of Classification Search
CPC .............. G11C 14/0018; G11C 7/1072; G11C 16/0441; G06F 12/0246; G06F 2212/7203; G06F 2212/2228
See application file for complete search history.

(56) References Cited

U.S. PATENT DOCUMENTS

| | | | |
|---|---|---|---|
| 7,453,712 B2 | 11/2008 | Kim et al. | |
| 8,078,794 B2 | 12/2011 | Lee et al. | |
| 8,209,466 B2 * | 6/2012 | Garratt | G06F 12/0246 711/103 |
| 2013/0254458 A1 * | 9/2013 | Pittelko | G06F 12/02 711/103 |
| 2014/0304566 A1 * | 10/2014 | Henderson | G06F 1/3275 714/764 |

* cited by examiner

*Primary Examiner* — Michael Alsip
(74) *Attorney, Agent, or Firm* — BainwoodHuang (57) ABSTRACT

A technique manages data in a flash memory drive which includes single-level cell (SLC) flash memory and multi-level cell (MLC) flash memory. The technique involves performing, within the flash memory drive, data placement operations on data which has been written to the flash memory drive. The technique further involves, based on the data placement operations, storing hot data in the SLC flash memory. The technique further involves, based on the data placement operations, storing cold data in the MLC flash memory, the hot data being accessed more frequently than the cold data. Such hot data and cold data can be distinguished based on access frequency.

20 Claims, 5 Drawing Sheets

UTILIZING A FLASH MEMORY DRIVE WHICH INCLUDES SINGLE-LEVEL CELL FLASH MEMORY AND MULTI-LEVEL CELL FLASH MEMORY

BACKGROUND

A conventional solid state drive (SSD) includes a SSD controller and flash memory. During operation, external circuitry sends data access commands to the SSD. The SSD controller responds to the data access commands by writing data into the flash memory or reading data from the flash memory depending on the particular commands.

One type of conventional SSD includes single-level cell (SLC) flash memory. In SLC flash memory, each cell stores one bit of information.

Another type of conventional SSD includes multi-level cell (MLC) flash memory. For one conventional SSD, each cell of the MLC flash memory stores two bits of information, i.e., each cell has four possible states. For another conventional SSD, each cell of the MLC flash memory stores three bits of information, i.e., each cell has eight possible states.

SUMMARY

Unfortunately, there are deficiencies to the above-described conventional SSDs which use only SLC flash memory, use only MLC flash memory with 2-bit cells, or use only MLC flash memory with 3-bit cells. In particular, SSDs which use only SLC flash memory are relatively expensive and do not provide the same storage density as that of SSDs which use only 2-bit or 3-bit MLC flash memory. Additionally, SSDs which use only 2-bit or 3-bit MLC flash memory are relatively slower (e.g., slower write operations), use more power, and are less reliable than SSDs which use only SLC flash memory.

In contrast to the above-described conventional SSDs which use only SLC flash memory or use only 2-bit or 3-bit MLC flash memory, improved techniques are directed to storing data in a flash memory drive which includes SLC flash memory and MLC flash memory. Such techniques are able to enjoy lower cost and higher storage density than a conventional SSD that uses only SLC flash memory. Additionally, such techniques are able to enjoy faster writes, more efficient power utilization, and higher reliability than a conventional SSD that uses only MLC flash memory. Moreover, hot data (i.e., more frequently accessed data) can be stored in the SLC flash memory for faster write operations and cold data (i.e., less frequently accessed data) can be stored in the MLC flash memory (e.g., less expensive storage costs).

One embodiment is directed to a method of managing data in a flash memory drive which includes SLC flash memory and MLC flash memory. The method includes performing, within the flash memory drive, data placement operations on data which has been written to the flash memory drive. The method further includes, based on the data placement operations, storing hot data in the SLC flash memory. The method further includes, based on the data placement operations, storing cold data in the MLC flash memory, the hot data being accessed more frequently than the cold data.

It should be understood that there are a variety of criteria that can be used to define hot data versus cold data. In some arrangements, identification of hot data and cold data based on access frequency (e.g., the number of times the data has been accessed within a predefined period of time). In other arrangements, identification of hot data and cold data based on most recent access time, i.e., which data was accessed most recently or last.

In some arrangements, performing the data placement operations includes detecting existence of cold data in the SLC flash memory. In these arrangements, storing the cold data in the MLC flash memory includes, in response to detecting existence of the cold data in the SLC flash memory, moving the cold data from the SLC flash memory into the MLC flash memory (e.g., during time that would otherwise be idle for the flash memory drive).

In some arrangements, performing the data placement operations includes detecting existence of hot data in the MLC flash memory. In these arrangements, storing the hot data in the SLC flash memory includes, in response to detecting the existence of the hot data in the MLC flash memory, moving the hot data from the MLC flash memory into the SLC flash memory (e.g., during time that would otherwise be idle for the flash memory drive).

In some arrangements, the data written to the flash memory drive is initially saved in the SLC flash memory. In these arrangements, performing the data placement operations includes labeling data as hot data and cold data while the data is initially saved in the SLC flash memory. Once the data in the SLC flash memory is appropriately labeled, any data that is labeled as cold data in the SLC flash memory can be moved from the SLC flash memory to the MLC flash memory based on such labeling.

In some arrangements, the flash memory drive further includes a dynamic random access memory (DRAM) cache (or buffer). In these arrangements, the data written to the flash memory drive is initially cached in the DRAM cache. Here, performing the data placement operations includes labeling data as hot data and cold data while the data is initially cached in the DRAM cache. Once the data in the cache is appropriately labeled, the data can be steered/directed for subsequent storage from the cache into either the SLC flash memory or the MLC flash memory based on such labeling.

Another embodiment is directed to a flash memory drive which includes SLC flash memory, MLC flash memory, and control circuitry coupled to the SLC flash memory and the MLC flash memory. The control circuitry is constructed and arranged to:
  (A) perform data placement operations on data which has been written to the flash memory drive,
  (B) based on the data placement operations, store hot data in the SLC flash memory, and
  (C) based on the data placement operations, store cold data in the MLC flash memory, the hot data being accessed more frequently than the cold data.

Yet another embodiment is directed to a data storage enclosure which includes a physical housing, a communications interface disposed within the physical housing, and a set of flash memory drives disposed within the physical housing and electronically coupled to the communications interface. Each flash memory drive includes SLC flash memory, MLC flash memory, and control circuitry coupled to the SLC flash memory and the MLC flash memory. In this embodiment, the control circuitry of each drive of the set of flash memory drives is constructed and arranged to (i) perform data placement operations on data which has been written to the flash memory drive through the communications interface, (ii) based on the data placement operations, store hot data in the SLC flash memory, and (iii) based on the data placement operations, store cold data in the MLC flash memory, the hot data being accessed more frequently than the cold data.

It should be understood that, in the cloud context, electronic circuitry such as certain external circuitry that writes data to the set of flash memory drives is formed by remote computer resources distributed over a network. Such electronic circuitry is capable of providing certain advantages such as high availability and data protection, transparent operation and enhanced security, big data analytics, etc.

Other embodiments are directed to electronic systems and apparatus, processing circuits, computer program products, and so on. Some embodiments are directed to various methods, electronic components and circuitry which are involved in managing data in a flash memory drive which includes both SLC flash memory and MLC flash memory.

BRIEF DESCRIPTION OF THE DRAWINGS

The foregoing and other objects, features and advantages will be apparent from the following description of particular embodiments of the present disclosure, as illustrated in the accompanying drawings in which like reference characters refer to the same parts throughout the different views. The drawings are not necessarily to scale, emphasis instead being placed upon illustrating the principles of various embodiments of the present disclosure.

DETAILED DESCRIPTION

An improved technique is directed to storing data in a flash memory drive which includes single-level cell (SLC) flash memory and multi-level cell (MLC) flash memory. Such a flash memory drive provides lower cost and higher storage density than a conventional SSD that uses only SLC flash memory. Additionally, such a flash memory drive provides faster writes, more efficient power utilization, and higher reliability than a conventional SSD that uses only MLC flash memory. In some arrangements, hot data (i.e., more frequently accessed data) is stored in the SLC flash memory for faster write operations and cold data (i.e., less frequently accessed data) is stored in the MLC flash memory (e.g., less expensive storage costs).

Figure 1:
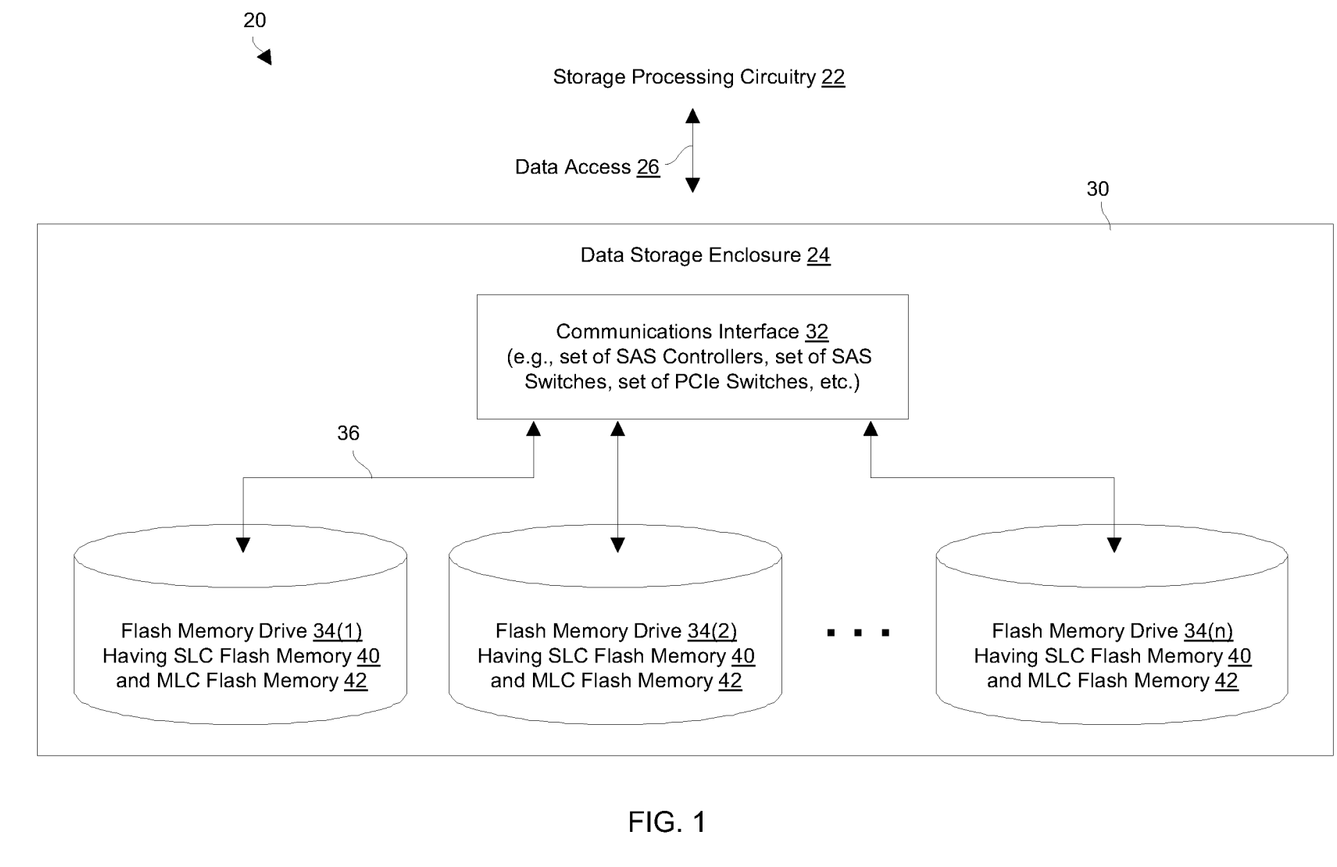
FIG. 1 is a block diagram of a data storage environment which utilizes a set of flash memory drives having both SLC flash memory and MLC flash memory.

FIG. 1 shows a data storage environment 20 which utilizes a set of flash memory drives having both SLC flash memory and MLC flash memory to robustly and reliably storage data. The data storage environment 20 includes storage processing circuitry 22 and a data storage enclosure 24. Such a data storage environment 20 may form all or part of a data storage system which processes input/output (I/O) requests (e.g., small computer system interface or SCSI commands on behalf of one or more host computers.

The storage processing circuitry 22 receives the I/O requests from the one or more host computers and, in turn, exchanges data access signals 26 with the data storage enclosure 24. Examples of suitable signal protocols include serial attached SCSI (SAS), peripheral component interconnect express (PCIe), and the like.

The data storage enclosure 24 includes a physical enclosure 30, a communications interface 32, and a set of flash memory drives 34. The physical enclosure 30 (e.g., a rack mount frame, chassis, etc.) is constructed and arranged to house and support the communications interface 32 and the set of flash memory drives 34(1), 34(2), . . . 34(n) (collectively, flash memory drives 34). The interface communications 32 is constructed and arranged to process the data access signals 26 from the storage processing circuitry 22 in order to store data 36 into the flash memory drives 34 and load data 36 from the flash memory drives 34 (SAS operations, PCIe operations, etc.). The set of flash memory drives 34 is constructed and arrange to store data in a non-volatile manner on behalf of the storage processing circuitry 22

By way of example, the data storage enclosure 34 can include an array of flash memory drives 34 (i.e., a disk array enclosure or DAE). In some arrangements, the data storage enclosure 34 configures the flash memory drives 34 into one or more rows flash memory drives 34 (e.g., a row of 15 drives 34, a row of 25 drives, etc.).

As will be explained in further detail shortly, each drive 34 of the set of flash memory drives 34 includes SLC flash memory 40 and MLC flash memory 42. It should be noted that hereinafter MLC flash memory 42 refers either to MLC flash memory with 2-bit cells, 3-bit cells, . . . , combinations thereof, and so on. Accordingly, one will appreciate that the SLC flash memory 40 may enjoy faster writes, more efficient power utilization, and higher reliability than the MLC flash memory 42. However, the MLC flash memory 42 may enjoy lower cost and higher storage density than the SLC flash memory 40. Further details will now be provided with reference to FIG. 2.

Figure 2:
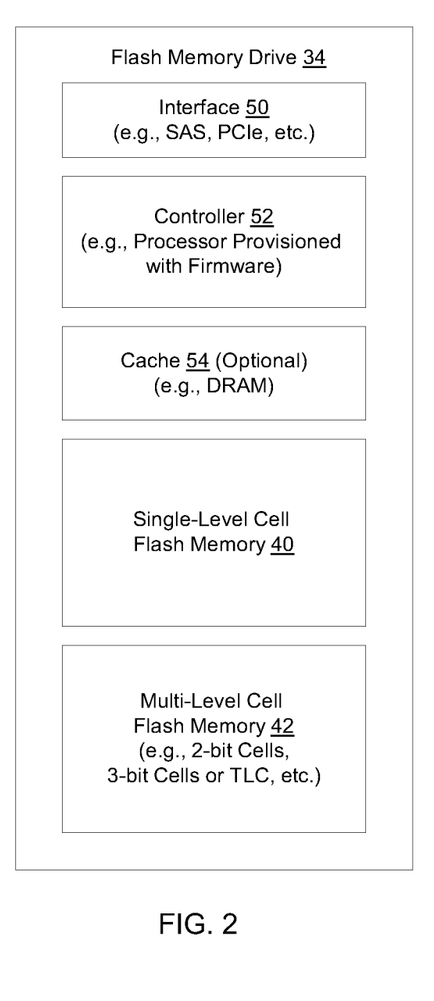
FIG. 2 is a block diagram of a flash memory drive of FIG. 1.

FIG. 2 shows particular details of a flash memory drive 34. As shown, the flash memory drive 34 includes an interface 50, a controller 52, an optional cache or buffer 54, SLC flash memory 40, and MLC flash memory 42 (also see FIG. 1).

The interface 50 is constructed and arranged to connect the flash memory drive 34 to an external device such as an external drive controller or switch (e.g., see the communications interface 32 of the data storage enclosure 24 of FIG. 1). Accordingly, the flash memory drive 34 is able to receive data from the external device for non-volatile storage, as well as provide data to the external device. In some arrangements, the interface 50 has multiple ports thus enabling the flash memory drive 34 to be accessed by multiple external devices for fault tolerance. Suitable protocols include SAS, PCIe, serial advanced technology attachment (SATA), etc.

The controller 52 is constructed and arrangement to perform data placement operations in order to smartly position hot data and cold data among the SLC flash memory 40 and the MLC flash memory 42. In some arrangements, the controller 52 includes memory to store metadata to which describes/tabulates/tracks/logs/etc. various aspects of the stored data in order to identify which stored data is hot data and which stored data is cold data.

As mentioned above, hot data is considered frequently accessed data while cold data is considered infrequently accessed data. One technique for distinguishing hot data from cold data is to consider when the data was written to the flash memory, e.g., data which was accessed earliest (without any further access) is considered the coldest data and data which was accessed most recently is considered the hottest data. Another technique for distinguishing hot data from cold data is by identifying which data has been accessed more than a predefined number of times within a particular time period (e.g., an hour, a day, a week, a month, etc.). Other techniques are suitable for use as well such as automated data placement techniques used in storing data within tiered storage.

The optional cache 54 is constructed and arranged for use by the controller 52 (e.g., for use as a data buffer, to manage flash memory addressing and flash memory spaces, for error correction and handling of error correction codes, for use in performing data placement operations, for use in managing metadata for the stored data, etc.). Dynamic random access memory (DRAM) is suitable for use as the optional cache 54.

The SLC flash memory 40 is constructed and arranged to store data which is written to the flash memory drive 34. Such SLC flash memory 40 may be formed via one or more SLC flash memory chips or modules.

Similarly, the MLC flash memory 42 is constructed and arranged to store data which is written to the flash memory drive 34. Such MLC flash memory 42 may be formed via one or more MLC flash memory chips or modules. The MLC flash memory may include 2-bit cell, 3-bit cells (e.g., triple-level cells), combinations thereof, etc. Further details will now be provided with reference to FIG. 3.

Figure 3:
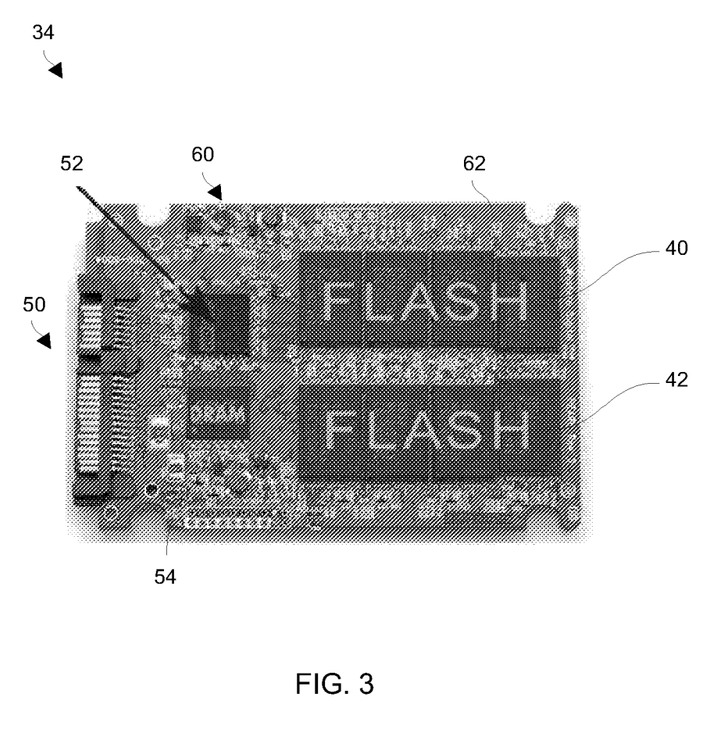
FIG. 3 is an example pictorial view of a flash memory drive of FIG. 1.

FIG. 3 provides an example pictorial view of certain details of a flash memory drive 34. As shown in FIG. 3, particular hardware components 60 of the flash memory drive 34 are mounted to a printed circuit board 62 which provide electrical connectivity among the components. It should be understood that additional hardware components 60 are mounted to the underside of the printed circuit board 62 as well.

It should be understood that the physical geometry of the flash memory drive 34 may have various forms. In some arrangements, as shown in the example of FIG. 2, the hardware of the flash memory drive 34 has a form factor which is suitable for a standard SSD or hard drive (e.g., 5.25", 3.5", 2.5", 1.8", etc.). In other arrangements, the hardware of the flash memory drive 34 has a form factor of a thumb drive (e.g., a USB peripheral). Other form factors are suitable for use as well. Further details will now be provided with reference to FIG. 4.

Figure 4:
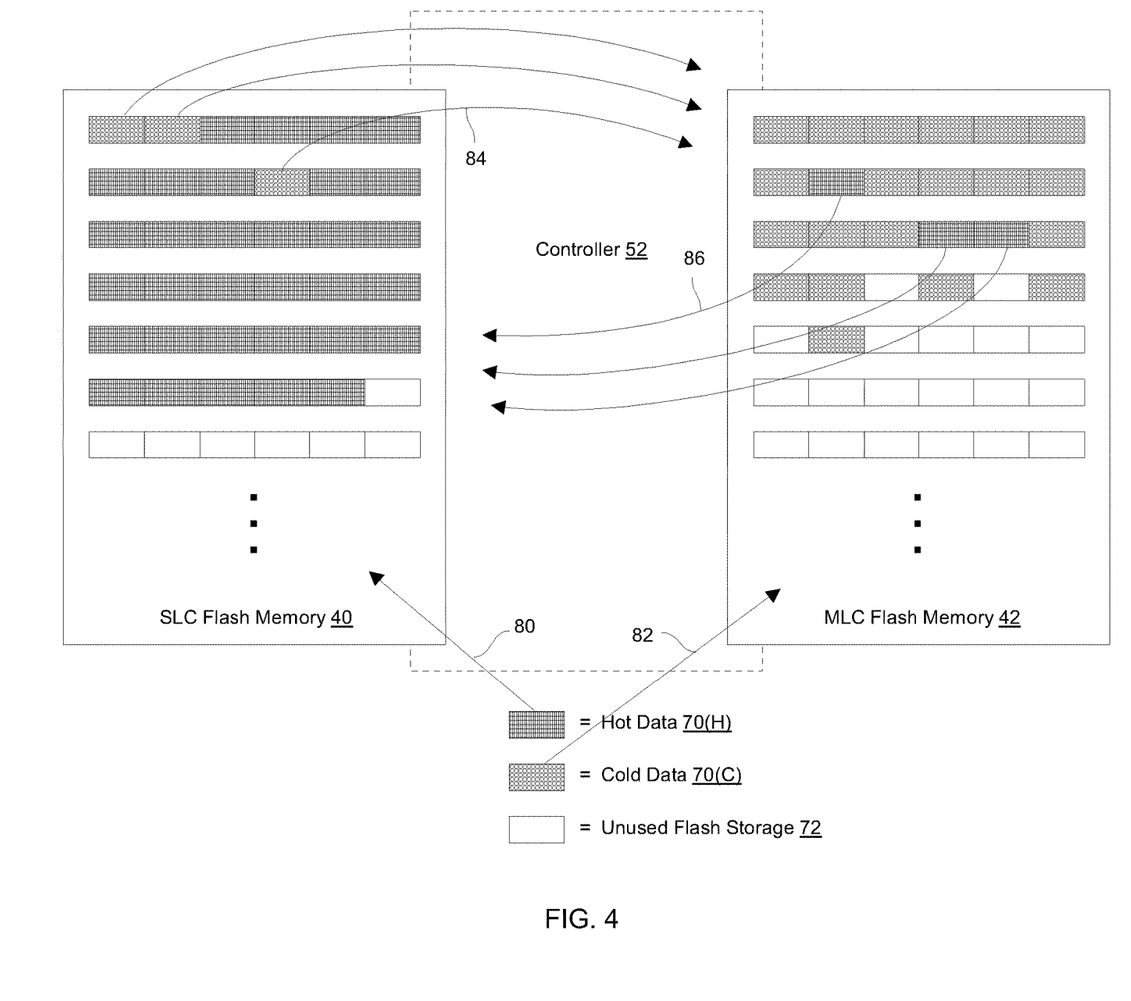
FIG. 4 is a block diagram illustrating data movement operations performed in the flash memory drive of FIG. 2.

FIG. 4 shows data movement operations which are performed by the controller 52 of the flash memory drive 34 of FIG. 2. In particular, upon receipt of new data through the interface 50 from an external device 32 such as a SAS controller, a PCIe switch, etc. (also see FIG. 1), the controller 52 immediately processes the new data.

In some arrangements, the controller 52 immediately places the new data in the SLC flash memory 40 and acknowledges successful non-volatile storage of the new data. That is, the controller 52 simply consumes unused flash storage 72 in the SLC flash memory 40. Such operation provides fast write operation time to the external device 32 (i.e., SLC flash memory write speed).

In other arrangements which utilize the optional cache 54 (FIGS. 2 and 3), the controller 52 performs data placement operations on the new data to determine whether the new data is hot data 70(H) or cold data 70(C) while the new data resides in the cache 54, and then transfers that new data from the cache 54 into the SLC flash memory 40 if the new data is considered hot data 70(H) (arrow 80) or from the cache 54 into the MLC flash memory 42 if the new data is considered cold data 70(C) (arrow 82). Here, write speed can still be considered fast if the acknowledgement is provided as soon as the new data reaches the cache 54 (i.e., DRAM write speed).

Additionally, as shown by the arrows 84, 86 in FIG. 4, the controller 52 is able to move already stored data from the SLC flash memory 40 to the MLC flash memory 42, and from the MLC flash memory 42 to the SLC flash memory 40. In particular, during idle time when the controller 52 is not performing any I/O operations, the controller 52 performs low priority or background data placement operations.

That is, during idle time events, the controller 52 determines whether any data in the SLC flash memory 40 has become cold data and, if so, evicts that cold data from the SLC flash memory 40 to the MLC flash memory 42. Once the cold data is moved from the SLC flash memory 40 to the MLC flash memory 42, the cold data now resides in a lower cost and higher storage density location thus freeing memory space in the SLC flash memory 40 (see the unused flash storage 72 in the SLC flash memory 40 in FIG. 4) for faster write operations of new data in the future.

Similarly, during idle time events, the controller 52 determines whether any data in the MLC flash memory 42 has become hot data and, if so, promotes that hot data from the MLC flash memory 42 to the SLC flash memory 40. Once the hot data is moved from the MLC flash memory 42 to the SLC flash memory 40, the hot data now resides in a higher reliability location and where the hot data can be quickly overwritten in the future (e.g., during a read-modify-write operation).

It should be understood that idle time events can be easily detected by the controller. For example, the controller 52 may consider the flash memory drive 34 to be idle after a predefined amount of time has passed since the controller 52 received a data access request (e.g., 30 seconds, one minute, 5 minutes, etc.).

It should be further understood that, depending on the criteria used to label data as hot data or cold data, the data within the flash memory drive 34 may transition from being hot data to cold data (e.g., as time passes). Likewise, the data within the flash memory drive 34 may transition from being cold data to hot data (e.g., after a read operation, after the data has been read a predefined number of times within a particular time period, etc.). In some arrangements, a simple bit or bit field is used to label or mark data, and the controller periodically moves data from the SLC flash memory 40 to the MLC flash memory or vice versa based on such labels. Further details will now be provided with reference to FIG. 5.

Figure 5:
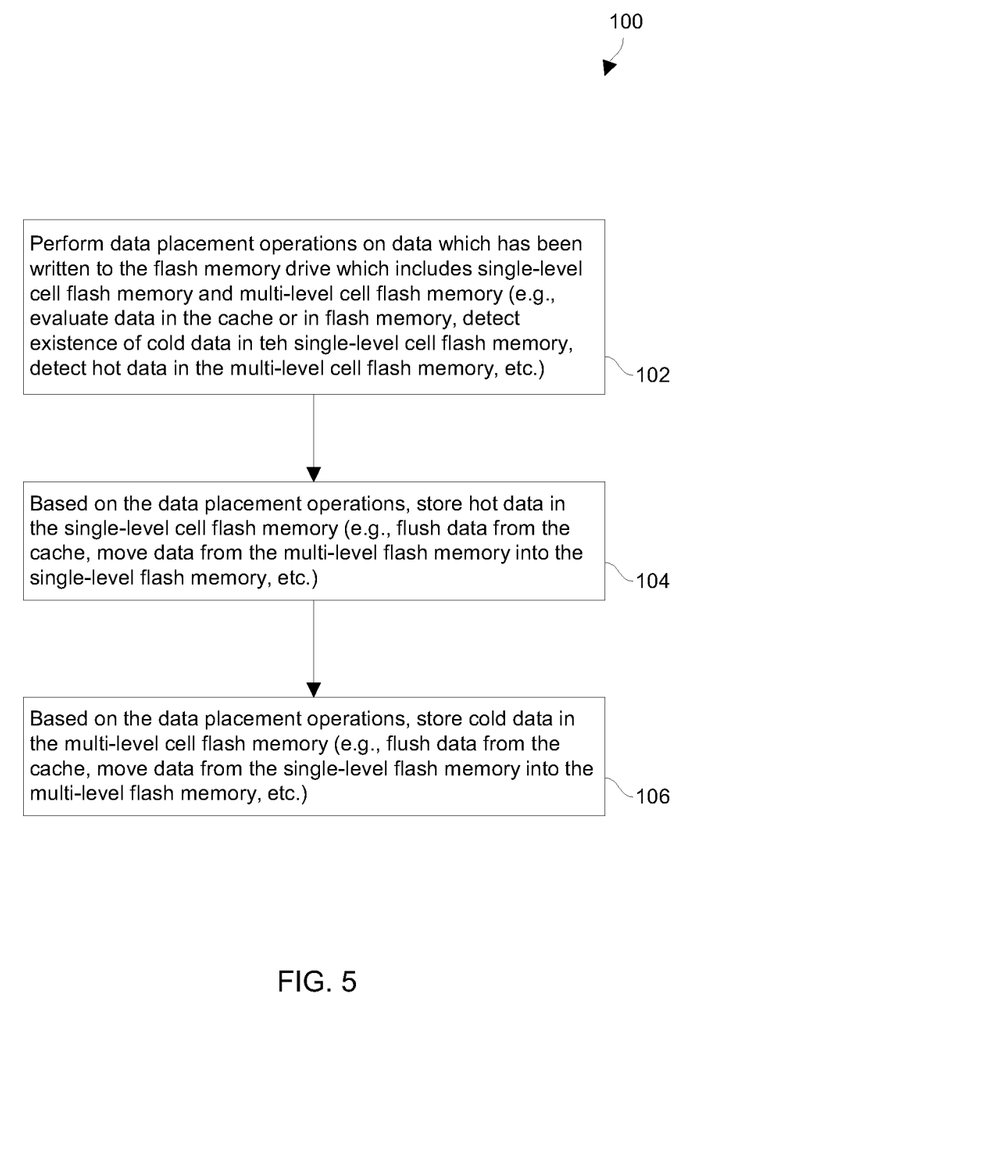
FIG. 5 is a flowchart of a procedure which is performed by the flash memory drive of FIG. 2.

FIG. 5 is a flowchart of a procedure 100 which is performed by circuitry of a flash memory drive 34 when managing data (also see FIGS. 2 through 4). At 102, the circuitry performs data placement operations on data which has been written to the flash memory drive 34. Along these lines, the circuitry may perform initial assessments of new data written to the flash memory drive 34. Furthermore, the circuitry may detect the existence of cold data in the SLC flash memory 40 and/or the existence of hot data in the MLC flash memory 42.

In 104, based on the data placement operations, the circuitry stores hot data in the SLC flash memory 40. Here, if all data is initially saved in the SLC flash memory 40, the hot data is maintained in the SLC flash memory 40. Additionally, if all data is initially buffered in the optional cache 54, the hot data is flushed from the cache 54 into the SLC flash memory 40. Furthermore, if cold data in the MLC flash memory 42 becomes hot data (e.g., during idle time), the hot data is then moved from the MLC flash memory 42 into the SLC flash memory 40 (also see FIG. 4).

In 106, based on the data placement operations, the circuitry stores cold data in the MLC flash memory 42, the hot data being accessed more frequently than the cold data. Here, if all data is initially saved in the SLC flash memory 40, the cold data is moved from the SLC flash memory 40 into the MLC flash memory 42. Also, if all data is initially buffered in the optional cache 54, the cold data is flushed from the cache 54 into the MLC flash memory 42. Additionally, if hot data in the SLC flash memory 40 becomes cold data (e.g., during idle time), the cold data is then moved from the SLC flash memory 40 into the MLC flash memory 42 (also see FIG. 4).

It should be understood that the activity 102 may be performed in an ongoing manner over the course of time. Some data placement operations may be performed in response to receipt of new data. Other data placement operations may be performed during idle time.

Additionally, activities 104 and 106 are performed continuously based on the data placement operations. Moreover, activities 104 and 106 may be performed in other orders, e.g., reverse order, concurrently or in parallel, combinations thereof, etc.

As mentioned above, improved techniques are directed to storing data in a flash memory drive 34 which includes SLC flash memory 40 and MLC flash memory 42. Such techniques are able to enjoy lower cost and higher storage density than a conventional SSD that uses only SLC flash memory. Additionally, such techniques are able to enjoy faster writes, more efficient power utilization, and higher reliability than a conventional SSD that uses only MLC flash memory. Moreover, hot data (i.e., more frequently accessed data) can be stored in the SLC flash memory 40 for faster write operations and cold data (i.e., less frequently accessed data) can be stored in the MLC flash memory 42 (e.g., less expensive storage costs).

While various embodiments of the present disclosure have been particularly shown and described, it will be understood by those skilled in the art that various changes in form and details may be made therein without departing from the spirit and scope of the present disclosure as defined by the appended claims.

Along these lines, it should be understood that various components of the data storage environment 20 such as storage processors (SPs) (e.g., see the storage processing circuitry 22 in FIG. 1) are capable of being implemented in or "moved to" the cloud, i.e., to remote computer resources distributed over a network. Here, the various computer resources may be distributed tightly (e.g., a server farm in a single facility) or over relatively large distances (e.g., over a campus, in different cities, coast to coast, etc.). In these situations, the network connecting the resources is capable of having a variety of different topologies including backbone, hub-and-spoke, loop, irregular, combinations thereof, and so on. Additionally, the network may include copper-based data communications devices and cabling, fiber optic devices and cabling, wireless devices, combinations thereof, etc. Furthermore, the network is capable of supporting LAN-based communications, SAN-based communications, combinations thereof, and so on.

Additionally, it should be understood that the flash memory drives 34 were shown as belonging to a data storage enclosure 24 by way of example only (FIG. 1). In other arrangements, the flash memory drives 34 may reside in other computerized environments such as in mainframes, large data storage systems or arrays, personal computers, general purpose computers, and so on.

Furthermore, in some arrangements, there are four main components: host interface, controller, cache and flash memory. The host interface (e.g., SATA, PCIe, etc.) connects the flash memory drive 34 through the interface to external circuitry of the host system. The controller (e.g., an embedded processor that executes firmware-level code) incorporates the electronics that bridge the memory components to the host computer and influences SSD performance. The cache (e.g., DRAM) depends on the controller, and is not mandatory component. The flash memory provides the space for storing data and ensure data persistence while no power is being supplied. One will appreciate that there are different types of flash memories available. Along these lines, there is SLC flash memory and MLC flash memory. Recently, a new type of flash memory has become available called as triple-level cell (TLC) flash memory. MLC flash memory and TLC flash memory are similar and each cell uses multiple levels to store multiple bits information, while each cell can exist in one of two states in SLC flash memory. In a comparison between SLC flash memory and MLC flash memory, SLC flash memory currently has lower power consumption, about 10× more persistent and 3× faster sequence write operations. However, SLC flash memory currently is 30% more expensive than MLC flash memory.

In some arrangements, SLC flash memory and MLC/TLC flash memory are combined together in one SSD to store data persistently. In particular, the SLC flash memory stores hot data and the MLC flash memory stores cold data. Hot data is the most frequent data accessed by the host.

In this arrangement, the data is firstly written into SLC flash memory through cache or directly from the host system if there is no cache in the SSD. The data is always stored in SLC flash memory unless the data is flagged as cold data. Additionally, the cold data is transferred to MLC/TLC flash memory. The data can move back from the MLC/TLC flash memory to the SLC flash memory if it becomes hot again.

In some arrangements, the data movement inside the SSD is at idle time to avoid a negative impact to SSD performance. Such movement may be transparent to the host system.

As described above, improved flash memory devices contain SLC flash memory and MLC/TLC flash memory. The controllers such devices are able to identify hot data and cold data. Such devices combine the advantages of SLC flash memory and MLC flash memory, namely, almost the same performance as a pure SLC flash memory SSD, higher durability, more persistent and lower power consumption than a pure MLC/TLC flash memory SSD, and lower cost than a pure SLC flash memory SSD. Such modifications, enhancements, and uses are intended to belong to various embodiments of the disclosure.

What is claimed is:

1. In a flash memory drive which includes single-level cell (SLC) flash memory and multi-level cell (MLC) flash memory, a method of managing data, the method comprising:

within the flash memory drive, performing data placement operations on data which has been written to the flash memory drive;

based on the data placement operations, storing hot data in the SLC flash memory; and based on the data placement operations, storing cold data in the MLC flash memory, the hot data being accessed more frequently than the cold data;

wherein performing the data placement operations includes detecting existence of cold data in the SLC flash memory;

wherein storing the cold data in the MLC flash memory includes, in response to detecting existence of the cold data in the SLC flash memory, moving the cold data from the SLC flash memory into the MLC flash memory;
wherein the method further comprises:
detecting occurrence of an idle time event within the flash memory drive; and
wherein moving the cold data from the SLC flash memory into the MLC flash memory is performed in response to detection of the occurrence of the idle time event.

2. A method as in claim 1 wherein performing the data placement operations includes detecting existence of hot data in the SLC flash memory; and
wherein storing the hot data in the SLC flash memory includes, in response to detecting existence of the hot data in the SLC flash memory, maintaining placement of the hot data in the SLC flash memory.

3. A method as in claim 1 wherein detecting the existence of the cold data in the SLC flash memory includes:
identifying the existence of the cold data in the SLC flash memory based on access frequency.

4. A method as in claim 1 wherein detecting the existence of the cold data in the SLC flash memory includes:
identifying the existence of the cold data in the SLC flash memory based on most recent access time.

5. A method as in claim 1 wherein performing the data placement operations further includes detecting existence of hot data in the MLC flash memory; and
wherein storing the hot data in the SLC flash memory includes, in response to detecting the existence of the hot data in the MLC flash memory, moving the hot data from the MLC flash memory into the SLC flash memory.

6. A method as in claim 5 wherein performing the data placement operations further includes detecting existence of cold data in the MLC flash memory; and
wherein storing the cold data in the MLC flash memory includes, in response to detecting the existence of the cold data in the MLC flash memory, maintaining placement of the cold data in the MLC flash memory.

7. A method as in claim 5 wherein moving the hot data from the MLC flash memory into the SLC flash memory is performed in response to detection of the occurrence of the idle time event.

8. A method as in claim 5 wherein detecting the existence of the hot data in the MLC flash memory includes:
identifying the existence of the hot data in the MLC flash memory based on access frequency.

9. A method as in claim 5 wherein detecting the existence of the hot data in the MLC flash memory includes:
identifying the existence of the hot data in the MLC flash memory based on most recent access time.

10. A method as in claim 1 wherein the data written to the flash memory drive is initially saved in the SLC flash memory; and
wherein performing the data placement operations includes labeling data as hot data and cold data while the data is initially saved in the SLC flash memory.

11. A method as in claim 1 wherein the flash memory drive further includes a dynamic random access memory (DRAM) cache;
wherein the data written to the flash memory drive is initially cached in the DRAM cache; and
wherein performing the data placement operations includes labeling data as hot data and cold data while the data is initially cached in the DRAM cache.

12. A flash memory drive, comprising:
single-level cell (SLC) flash memory;
multi-level cell (MLC) flash memory; and
control circuitry coupled to the SLC flash memory and the MLC flash memory, the control circuitry being constructed and arranged to:
perform data placement operations on data which has been written to the flash memory drive,
based on the data placement operations, store hot data in the SLC flash memory, and
based on the data placement operations, store cold data in the MLC flash memory, the hot data being accessed more frequently than the cold data;
wherein the control circuitry, when performing the data placement operations, is constructed and arranged to detect existence of cold data in the SLC flash memory;
wherein the control circuitry, when storing the cold data in the MLC flash memory, is constructed and arranged to, in response to detecting existence of the cold data in the SLC flash memory, move the cold data from the SLC flash memory into the MLC flash memory;
wherein the control circuitry is further constructed and arranged to:
detect occurrence of an idle time event within the flash memory drive; and
wherein moving the cold data from the SLC flash memory into the MLC flash memory is performed in response to detection of the occurrence of the idle time event.

13. A flash memory drive as in claim 12 wherein the control circuitry, when performing the data placement operations, is further constructed and arranged to detect existence of hot data in the MLC flash memory; and
wherein the control circuitry, when storing the hot data in the SLC flash memory, is constructed and arranged to, in response to detecting the existence of the hot data in the MLC flash memory, move the hot data from the MLC flash memory into the SLC flash memory.

14. A flash memory drive as in claim 12 wherein the control circuitry, when performing the data placement operations, is further constructed and arranged to detect existence of hot data in the MLC flash memory; and
wherein the control circuitry, when storing the hot data in the SLC flash memory, is constructed and arranged to, in response to (i) detecting the existence of the hot data in the MLC flash memory and (ii) the idle time event, move the hot data from the MLC flash memory into the SLC flash memory.

15. A flash memory drive as in claim 14 wherein the data written to the flash memory drive is initially saved in the SLC flash memory; and
wherein the control circuitry, when performing the data placement operations, is constructed and arranged to label data as hot data and cold data while the data initially resides in the SLC flash memory.

16. A flash memory drive as in claim 14, further comprising:
a dynamic random access memory (DRAM) cache coupled to the control circuitry;
wherein the data written to the flash memory drive is initially cached in the DRAM cache; and
wherein the control circuitry, when performing the data placement operations, is constructed and arranged to label data as hot data and cold data while the data is initially cached in the DRAM cache.

17. A data storage enclosure, comprising:
a physical housing;
a communications interface disposed within the physical housing; and a set of flash memory drives disposed within the physical housing and electronically coupled to the communications interface, each flash memory drive including:
single-level cell (SLC) flash memory,
multi-level cell (MLC) flash memory, and
control circuitry coupled to the SLC flash memory and the MLC flash memory, the control circuitry being constructed and arranged to (i) perform data placement operations on data which has been written to the flash memory drive through the communications interface, (ii) based on the data placement operations, store hot data in the SLC flash memory, and (iii) based on the data placement operations, store cold data in the MLC flash memory, the hot data being accessed more frequently than the cold data;
wherein the control circuitry, when performing the data placement operations, is constructed and arranged to detect existence of cold data in the SLC flash memory;
wherein the control circuitry, when storing the cold data in the MLC flash memory, is constructed and arranged to, in response to detecting existence of the cold data in the SLC flash memory, move the cold data from the SLC flash memory into the MLC flash memory;
wherein the control circuitry is further constructed and arranged to:
detect occurrence of an idle time event within the flash memory drive; and
wherein moving the cold data from the SLC flash memory into the MLC flash memory is performed in response to detection of the occurrence of the idle time event.

18. A method as in claim 1 wherein detecting the occurrence of the idle time event within the flash memory drive includes:
by circuitry within the flash memory drive, measuring an amount of time that passes since receiving a data access request, and indicating the occurrence of the idle time event when the measured amount of time reaches the predefined amount of time.

19. A method as in claim 18 wherein performing the data placement operations further includes (i) detecting existence of hot data in the SLC flash memory and (ii) detecting existence of hot data and cold data in the MLC flash memory;
wherein storing the hot data in the SLC flash memory includes maintaining existing hot data in the SLC flash memory and, in response to the idle time event, moving new hot data from the MLC flash memory into the SLC flash memory; and
wherein storing the cold data in the MLC flash memory further includes maintaining existing cold data in the MLC flash memory.

20. A method as in claim 19 wherein the predefined amount of time is at least one minute.

* * * * *